(12) United States Patent  
Tekletsadik et al.

(10) Patent No.: US 7,999,239 B2
(45) Date of Patent: Aug. 16, 2011

(54) TECHNIQUES FOR REDUCING AN ELECTRICAL STRESS IN AN ACCELERATION/DECELERAION SYSTEM

(75) Inventors: Kasegn D. Tekletsadik, Rexford, NY (US); Russell J. Low, Rowley, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 706 days.

(21) Appl. No.: 11/968,527

(22) Filed: Jan. 2, 2008

(65) Prior Publication Data

US 2009/0145228 A1    Jun. 11, 2009

Related U.S. Application Data

(60) Provisional application No. 61/012,747, filed on Dec. 10, 2007.

(51) Int. Cl.
   *G21K 5/04* (2006.01)
   *H05H 5/06* (2006.01)

(52) U.S. Cl. ........... 250/492.21; 250/492.3; 315/111.81; 315/5.41; 315/500; 315/506; 313/359.1; 313/360.1

(58) Field of Classification Search .................. None
   See application file for complete search history.

(56) References Cited

U.S. PATENT DOCUMENTS

| | | | | |
|---|---|---|---|---|
| 5,059,859 A | * | 10/1991 | Endo et al. | 313/443 |
| 5,463,268 A | * | 10/1995 | Schroeder | 313/293 |
| 6,130,436 A | | 10/2000 | Renau et al. | |
| 6,653,642 B2 | | 11/2003 | Pedersen et al. | |
| 6,717,079 B2 | | 4/2004 | Heller | |
| 7,402,821 B2 | | 7/2008 | Bernhardt | |
| 7,675,046 B2 | * | 3/2010 | Tekletsadik et al. | 250/492.21 |
| 7,692,139 B2 | * | 4/2010 | Koo et al. | 250/492.21 |
| 2009/0050347 A1 | * | 2/2009 | Tekletsadik et al. | 174/120 SR |
| 2009/0057572 A1 | * | 3/2009 | Tekletsadik et al. | 250/492.21 |
| 2009/0057573 A1 | * | 3/2009 | Low et al. | 250/492.21 |
| 2009/0072163 A1 | * | 3/2009 | Lubicki et al. | 250/492.21 |

FOREIGN PATENT DOCUMENTS

JP    H06-111755 A    4/1994

OTHER PUBLICATIONS

U.S. Appl. No. 11/845,441, Tekletsadik, et al.
U.S. Appl. No. 11/847,139, Low, et al.
U.S. Appl. No. 11/841,086, Tekletsadik, et al.
U.S. Appl. No. 11/527,842, Tekletsadik, et al.
U.S. Appl. No. 11/872,576, Low, et al.
U.S. Appl. No. 11/854,852, Lubicki, et al.

* cited by examiner

*Primary Examiner* — Jack Berman

(57) ABSTRACT

Techniques for reducing an electrical stress in a acceleration/deceleration system are disclosed. In one particular exemplary embodiment, the techniques may be realized as an acceleration/deceleration system. The acceleration/deceleration system may comprise an acceleration column including a plurality of electrodes having apertures through which a charged particle beam may pass. The acceleration/deceleration system may also comprise a plurality of voltage grading components respectively electrically coupled to the plurality of electrodes. The acceleration/deceleration system may further comprise a plurality of insulated conductors disposed proximate the plurality of voltage grading components to modify an electrical field about the plurality of voltage grading components.

22 Claims, 5 Drawing Sheets

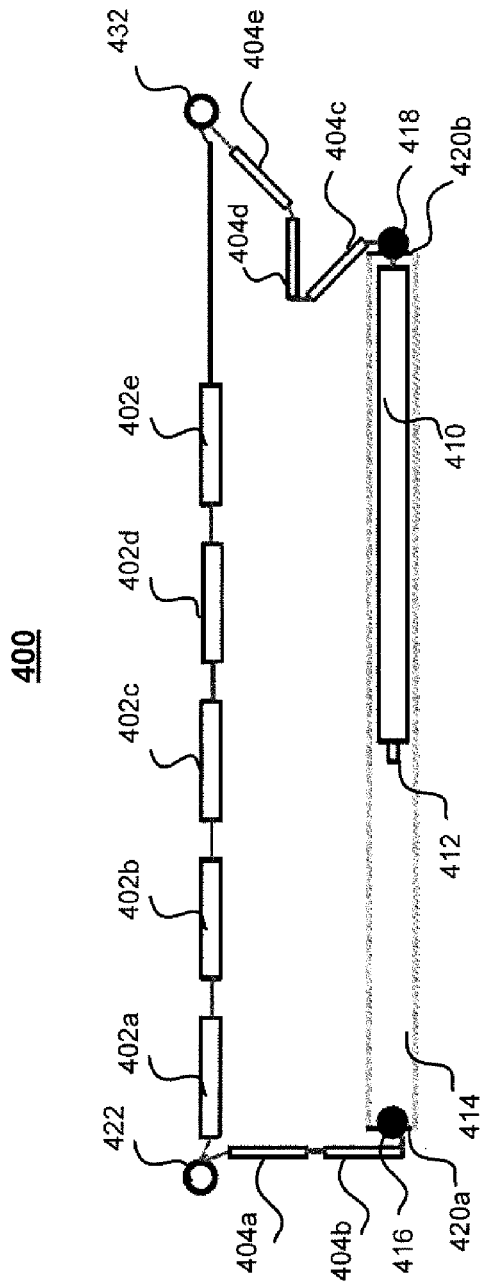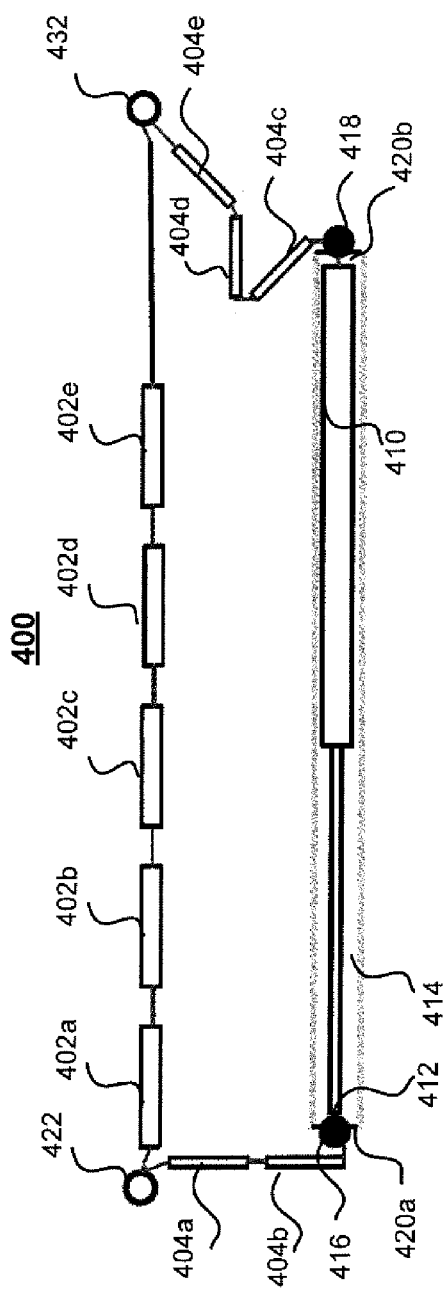

TECHNIQUES FOR REDUCING AN ELECTRICAL STRESS IN AN ACCELERATION/DECELERAION SYSTEM

CROSS-REFERENCE TO RELATED APPLICATIONS

This patent application claims priority to U.S. Provisional Patent Application No. 61/012,747, filed Dec. 10, 2007, which is hereby incorporated by reference herein in its entirety.

FIELD OF THE DISCLOSURE

The present disclosure relates generally to semiconductor manufacturing and, more particularly, to techniques for reducing an electrical stress in an acceleration/deceleration system.

BACKGROUND OF THE DISCLOSURE

Ion implantation is a process of depositing chemical species into a substrate by direct bombardment of the substrate with energized ions. In semiconductor manufacturing, ion implanters are used primarily for doping processes that alter the type and level of conductivity of target materials. A precise doping profile in an integrated circuit (IC) substrate and its thin-film structure is often crucial for proper IC performance. To achieve a desired doping profile, one or more ion species may be implanted in different doses and at different energy levels.

To form devices on a semiconductor wafer, it is usually necessary to implant impurities at different depths of the semiconductor wafer. The energy of impurities in an ion beam directed toward the semiconductor wafer is determinative of the depth to which the impurities penetrate into the semiconductor wafer. As devices are reduced in size and their operating speeds are increased, it has become desirable to use very low energy ion beams to form, for example, shallow transistor junctions in the semiconductor wafer.

At the same time, high energy ion implantation may help minimize production costs because high energy ion implantation does not require some conventional processes, such as, but not limited to, the masking of a semiconductor wafer, to be performed. Also, semiconductor devices manufactured through the use of high energy ion implantation may exhibit relatively low levels of junction leakage and improved latch-up characteristics. Thus, the production yield may be high with respect to an ion implantation process carried out by high energy ion implantation. Therefore, high energy ion implantation may be beneficial for implanting ions in at least one or more semiconductor device manufacturing processes.

FIG. 1 depicts a prior art ion implanter system 100. The ion implanter system 100 may comprise an ion source 102 and a complex series of components through which an ion beam 10 passes. The series of components may include, for example, an extraction manipulator 104, a filter magnet 106, an acceleration or deceleration column 108, an analyzer magnet 110, a rotating mass slit 112, a scanner 114, and a corrector magnet 116. The ion source 102, the extraction manipulator 104, and the filter magnet 106 may be housed in a terminal 118. Much like a series of optical lenses that manipulate a light beam, the ion implanter components can filter and focus the ion beam 10 before steering it towards an end station 120. The ion implanter components that can filter and focus the ion beam 10 may be referred to as optical elements, or beam optics.

The acceleration or deceleration column 108 is a critical component to the ion implanter system 100. As the range of required energy levels for the ion beam 10 may be wide (e.g., from about 1 kV to above 600 kV), the acceleration or deceleration column 108 may be required to accelerate or decelerate ions using a wide voltage spectrum (e.g., from about 1 kV to above 600 kV).

Conventionally, a resistive divider may be used to gradually accelerate (divide the acceleration potential) or decelerate (divide the deceleration potential) the ion beam 10 along the column 108. That is, one or more resistors may be electrically connected between adjacent electrodes along the column 108. A plurality of resistors may thus form a chain of resistors. Each electrode of the column 108 may be electrically connected to certain electrical contacts along the resistor chain. Thus, the acceleration or deceleration voltage may be distributed by the resistors. The distribution of voltage along the column 108 may be referred to as grading. As the operational voltage spectrum gets wider and the voltage increases, there may be concerns with the conventional resistive divider.

For example, the conventional resistive divider may use switches to select a different resistor chain with lower resistance for low energy acceleration and deceleration. The switches may be activated electrically and may be referred to as electrical switches. The electrical switches may be activated by relays, for example. The switches may also be powered by pressurized fluid and may be referred to as hydraulic/pneumatic switches. The hydraulic/pneumatic switches may be activated by pressurized media in a conduit made of dielectric material (e.g., polytetrafluoroethylene (PTFE) air lines). However, due to a difference in dielectric constant of the conduit and surrounding air, the conduit may be subjected to high electrical stress and may cause high voltage instability of the column 108. To avoid this from happening, proper shielding and insulation of the resistive divider may be needed to ensure the proper function of the column 108.

Also, each resistor component and/or switch in the conventional resistive divider may be required to be protected against high electric field stress when the conventional resistive divider is operating in a wide range of voltages for ion implantation. For example, in a high energy mode, a high acceleration voltage (e.g., above 650 kV) may be graded over the resistor chain. Conductive materials of the resistors, such as lead or ferrule connections, may need shielding due to high electric field stress. Such shielding has previously been achieved by placing the resistor chain in a pressurized vessel that may be filled with a high dielectric strength material (e.g., SF6 gas) Also, the conventional resistive divider may arc at lower than desired voltages from airline holes. Additionally, service of the resistor chain is not easy in such a configuration as the pressurized vessel needs to be drained, which may be slow and labor intensive.

In view of the foregoing, it may be understood that there are significant problems and shortcomings associated with current technologies for controlling an accelerated or decelerated charged particle beam for ion implanters.

SUMMARY OF THE DISCLOSURE

Techniques for reducing an electrical stress in an acceleration/deceleration system are disclosed. In one particular exemplary embodiment, the techniques may be realized as an acceleration/deceleration system. The acceleration/deceleration system comprise an acceleration column including a plurality of electrodes having apertures through which a charged particle beam may pass. The acceleration/deceleration system may also comprise a plurality of voltage grading components respectively electrically coupled to the plurality of electrodes. The acceleration/deceleration system may further comprise a plurality of insulated conductors disposed proximate the plurality of voltage grading components to modify an electrical field about the plurality of voltage grading components.

In accordance with other aspects of this particular exemplary embodiment, the plurality of voltage grading components may comprise at least one of a plurality of resistors and a plurality of switches.

In accordance with further aspects of this particular embodiment, the plurality of resistors may comprise a serial chain of resistors.

In accordance with additional aspects of this particular exemplary embodiment, the acceleration/deceleration system may further comprise a stem coupled to the plurality of voltage grading components and the plurality of insulated conductors.

In accordance with yet another aspect of this particular exemplary embodiment, the acceleration/deceleration system may further comprise a plurality of actuators.

In accordance with still another aspect of this particular exemplary embodiment, each switch may be connected to a respective one of the plurality of actuators.

In accordance with further aspects of this particular exemplary embodiment, at lease one switch may be activated by pressurized fluid, and the pressurized fluid may include at least one of a pressurized air, a pressurized gas, and a pressurized liquid.

In accordance with additional aspects of this particular exemplary embodiment, the acceleration/deceleration system may further comprise a plurality of spark gap electrodes configured to electrically breakdown at a predetermined voltage.

In accordance with another aspect of this particular exemplary embodiment, the plurality of spark gap electrodes may be disposed between the plurality of voltage grading components and the plurality of insulated conductors.

In accordance with yet another aspect of this particular exemplary embodiment, the plurality of spark gap electrodes and the plurality of insulated conductors may be disposed proximate a plurality of actuators.

In accordance with still another aspect of this particular exemplary embodiment, the plurality of resistors may be potted in a high dielectric strength material including at least one of a heat conductive epoxy and a silicone based compound.

In another particular exemplary embodiment, techniques for may be realized as an acceleration/deceleration system. The acceleration/deceleration system comprise an acceleration column including a plurality of electrodes having apertures through which a charged particle beam may pass. The acceleration/deceleration system may also comprise a plurality of voltage grading components respectively electrically coupled to the plurality of electrodes. The acceleration/deceleration system may further comprise a plurality of spark gap electrodes disposed proximate the plurality of voltage grading components to electrically breakdown at a predetermined voltage level. The acceleration/deceleration system may furthermore comprise a plurality of insulated conductors disposed proximate of the plurality of voltage grading components to modify the electrical field stress about the plurality of voltage grading components.

In accordance with further aspects of this particular exemplary embodiment, the plurality of voltage grading components may further comprise at least one of a plurality of resistors and a plurality of switches.

In accordance with additional aspects of this particular exemplary embodiment, the plurality of resistors may comprise a serial chain of resistors.

In accordance with another aspect of this particular exemplary embodiment, a shape of the plurality of spark gap electrodes may be configured to be at least one of an elliptical shape and spherical shape.

In accordance with yet another aspect of this particular exemplary embodiment, the acceleration/deceleration system may further comprise a plurality of actuators.

In accordance with still another aspect of this particular exemplary embodiment, each switch may be connected to a respective one of the plurality of actuators.

In accordance with other aspects of this particular exemplary embodiment, at least one of the plurality of spark gap electrodes and the plurality of insulated conductors may be disposed proximate the connection between each switch and the respective one of the plurality of actuators.

In accordance with further aspects of this particular exemplary embodiment, at least one switch may be activated by pressurized fluid, and the pressurized fluid may include at least one of a pressurized air, a pressurized gas, and a pressurized liquid.

In accordance with other aspects of this particular exemplary embodiment, the plurality of insulated conductors may be disposed radially further away from the plurality of voltage grading components than the plurality of spark gap electrodes.

In accordance with further aspects of this particular exemplary embodiment, the plurality of resistors may be embedded in a high dielectric strength material including at least one of a heat conductive epoxy and a silicone based compound.

In accordance with additional aspects of this particular exemplary embodiment, the predetermined voltage level at which the plurality of spark gap electrodes electrically breakdown may be based at least on one of a size of a conductor located within the plurality of insulated conductor, a length of the stem, and a geometry of the plurality of spark gap electrodes.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 4A depicts a schematic diagram of a resistor assembly in accordance with an embodiment of the present disclosure.

FIG. 4B depicts a schematic diagram of a resistor assembly in accordance with an embodiment of the present disclosure.

DETAILED DESCRIPTION OF EXEMPLARY EMBODIMENTS

Figure 1:
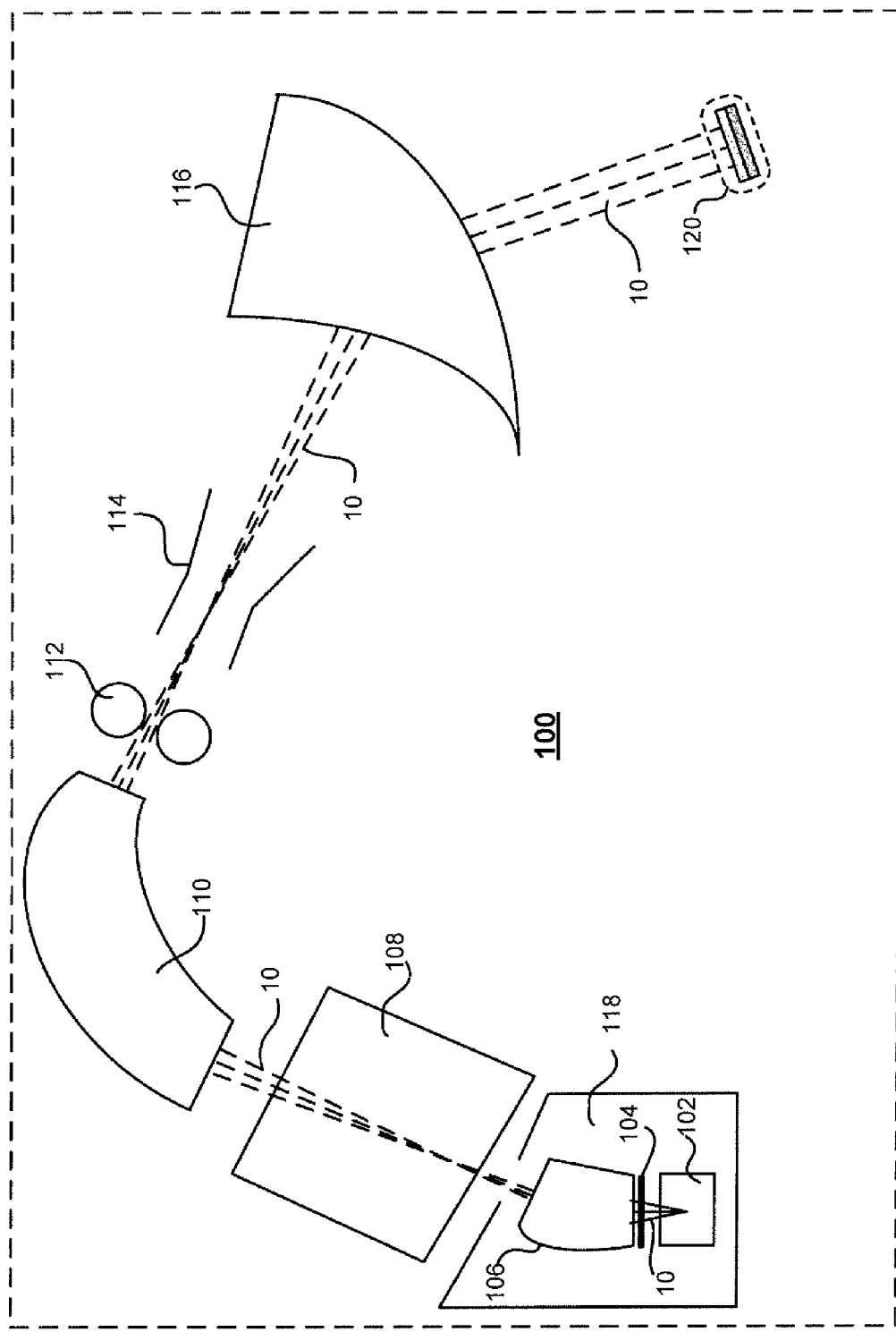
FIG. 1 depicts a conventional ion implanter system.
Figure 2:
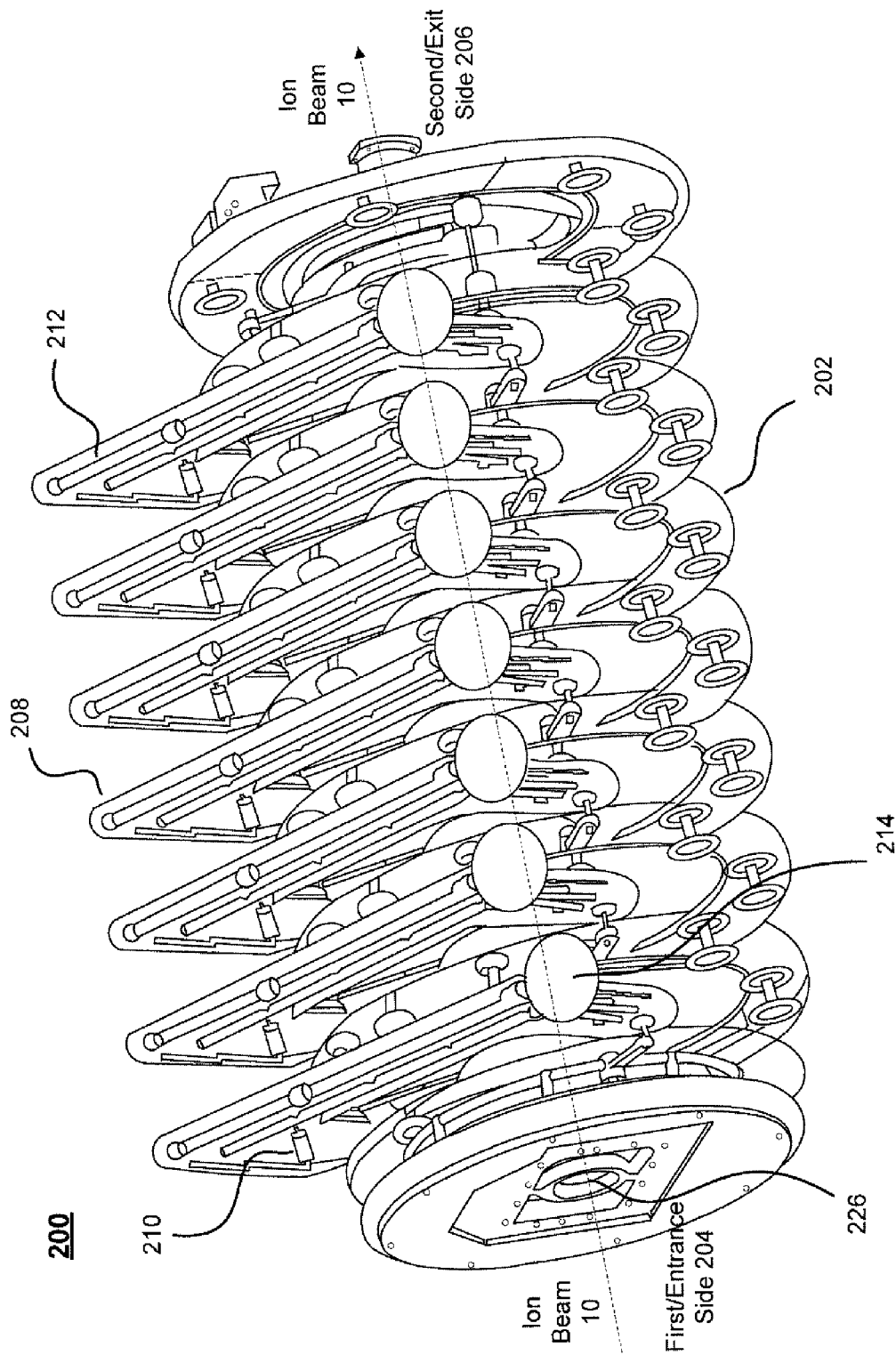
FIG. 2 depicts 3-dimensional diagram of an acceleration/deceleration system in accordance with an embodiment of the present disclosure.

FIG. 2 depicts a 3-dimensional diagram of an acceleration/deceleration system 200 of an ion implanter in accordance with an embodiment of the present disclosure. It should be appreciated by one skilled in the art that only the ion beam 10 and acceleration or deceleration column 108 are incorporated into FIG. 2. As a result, those elements in FIG. 2 should be understood in relation to corresponding elements in FIG. 1.

Referring to FIG. 2, in the acceleration/deceleration system 200, the ion beam 10 may be extracted from the ion source 102 (shown in FIG. 1). The acceleration/deceleration system 200 may comprise a bushing 202 that may be adapted for installation along a path of the ion beam 10. The bushing 202 may enclose the ion beam 10 and a plurality of electrodes (not shown). A first side 204 of the acceleration/deceleration system 200 may be referred to as an "entrance side" since particles from the ion beam 10 may enter the acceleration/deceleration system 200 through an aperture 226 ("column aperture") on the first side 204 of the acceleration/deceleration system 200. A second side 206 of the acceleration/deceleration system 200 may be referred to as an "exit side" since particle from the ion beam 10 may exit the acceleration/deceleration system 200 through the aperture 226.

The ion beam 10 may be accelerated or decelerated by the acceleration/deceleration system 200 while traveling through the aperture 226. The acceleration or deceleration of the ion beam 10 may be controlled by one or more voltage grading components 208. The one or more voltage grading components 208 may include one or more resistors 210 and/or one or more switches 212. For example, the one or more resistors 210 may be one or more resistor links set to a predetermined resistance. Also, the one or more switches 212 may be one or more pistons. The one or more resistors 210 and/or the one or more switches 212 may be embedded in a dielectric material having a high dielectric strength. The dielectric material may include at least one of a heat conductive epoxy and a silicone based compound. The one or more switches 212 may be coupled to an actuator (not shown) The actuator (not shown) may actuate the one or more switches 212 and may short out the one or more resistors 210 within the one or more voltage grading components 208. Therefore, by controlling the resistance of the voltage grading component 208, the voltage applied to the acceleration/deceleration system 200 may be varied. For example, a predetermined level of current (e.g., 0.5 mA) may be flowing through the acceleration/deceleration system 200 when a voltage of 520-545 kV is applied. In the event that a mid-level voltage (e.g., approximately 350 kV) is applied to the acceleration/deceleration system 200, the resistance of the acceleration/deceleration system 200 may be adjusted to maintain the same level of current flow. For example, the resistance of four of the voltage grading components 208 may be shorted by actuating the switches 212 of the four voltage grading components 208. In the event that a low-level voltage (e.g., 120 kV) is applied to the acceleration/deceleration system 200, the resistance of the acceleration/deceleration system 200 may be adjusted to maintain the same level of current flow. For example, the resistance of seven of the voltage grading components 208 may be shorted by actuating the switches 212 of the seven voltage grading components 208. Therefore, any combination of the one or more voltage grading components 208 may be shorted to adjust to various voltages applied to the acceleration/deceleration system 200.

The actuator (not shown) and the one or more switches 212 may be embedded in different dielectric material, respectively, having different dielectric constants. Therefore, a high electrical field stress may be created at a junction between the actuator (not shown) and the one or more switches 212. Also, the junction between the actuator (not shown) and the one or more switches 212 may not be a smooth surface and therefore result in creating an electrical field stress. In order to reduce the electrical field stress at the junction, one or more insulated conductors 214 may be disposed proximate an exterior portion of the one or more voltage grading components 208 to modify an electric field about the one or more voltage grading components 208. The one or more insulated conductors 214 may be spaced at a predetermined distance (e.g., approximately 4.5 inches) to reduce the electrical field stress. The one or more insulated conductors 214 may include an insulator (e.g., having dielectric strength greater than 75 kilovolts (kV)/inch) disposed about a conductor. Electric stress on a surface of the conductor may be high due to high applied voltages and a small radius of the conductor. Therefore, an insulator having an optimized thickness may be disposed about the conductor to reduce the electrical stress. The electric stress may be lowered once electrical field lines exit the insulator of the one or more insulated conductors 214. Hence, the one or more insulated conductors 214 reduce electrical field stress at the junction of the actuator (not shown), and the one or more switches 212 and help to promote a more uniform electrical field. In other words, the one or more insulated conductor 214 may function as an electrical field stress shield. Therefore, the junction between the actuator (not shown) and the one or more switches 212 may be protected from electrical field stress.

Figure 3:
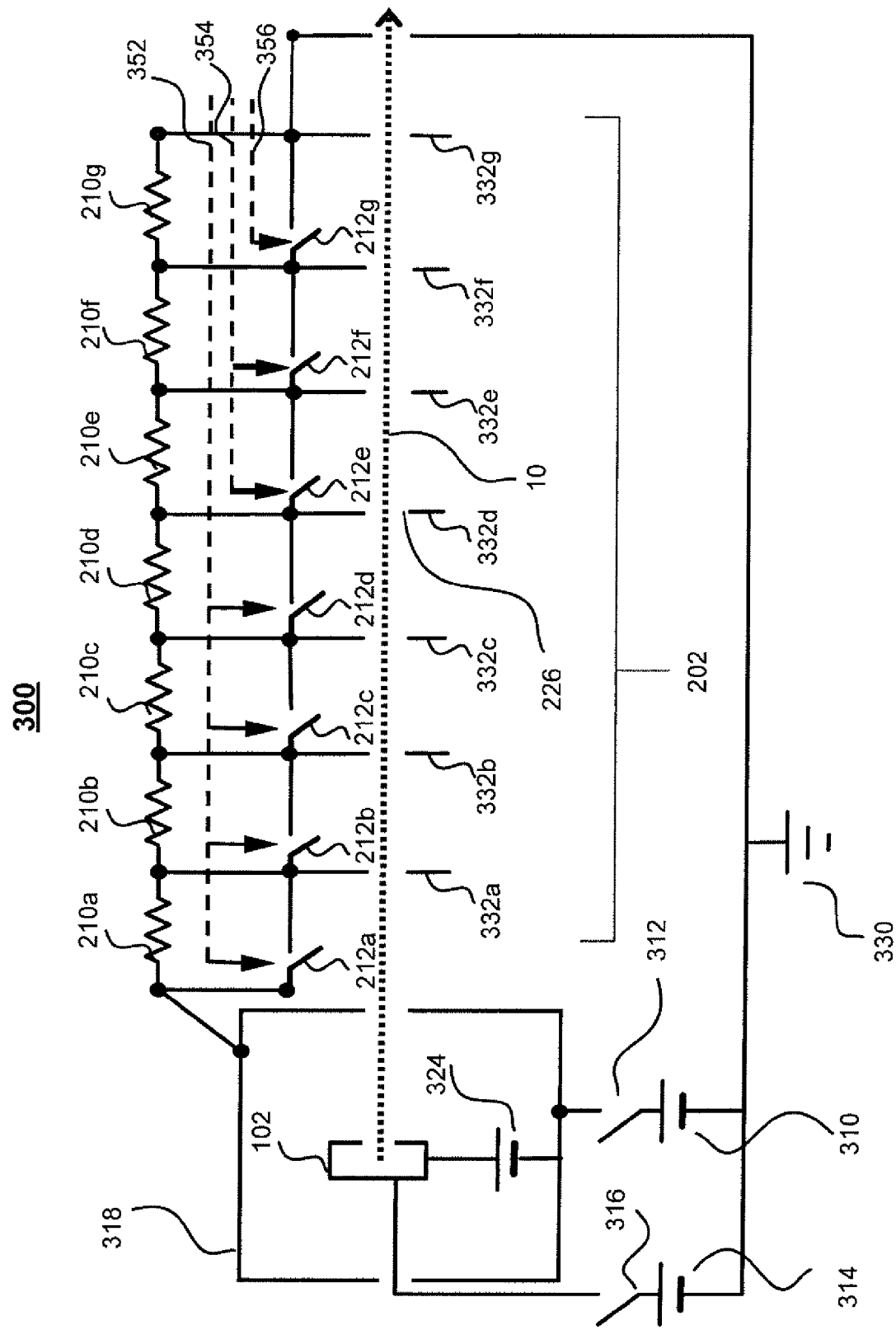
FIG. 3 depicts a schematic diagram of an acceleration/deceleration system in accordance with an embodiment of the present disclosure.

Referring to FIG. 3, there is shown an exemplary schematic diagram of an acceleration/deceleration system 300 of an ion implanter in accordance with an embodiment of the present disclosure. The ion source 102 may be referenced to an extraction power supply 324. The extraction power supply 324 may provide a positive voltage for the ion source 102 relative to a terminal 318. The ion source 102 may be separated from a ground 330 by a deceleration switch 316 and a deceleration power supply 314. The ion source 102 may also be separated from the ground 330 via the extraction power supply 324, an acceleration switch 312, and an acceleration power supply 310. The terminal 318 may be separated from the ground 330 by the acceleration switch 312 and the acceleration power supply 310. It should be noted that the charged particle acceleration/deceleration system 300 in accordance with the present disclosure may accelerate and/or decelerate the ion beam 10.

The ion beam 10 passes through an aperture on the terminal 318 and enters the acceleration/deceleration bushing 202 shown in FIG. 2. The acceleration/deceleration bushing 202 may be depicted in FIG. 3 by a plurality of electrodes 332. In the embodiment of FIG. 3, the plurality of electrodes 332 includes electrodes 332a, 332b, 332c, 332d, 332e, 332f, and 332g. The ion beam 10 may be accelerated or decelerated to a specific energy level and then leave the acceleration/deceleration bushing 202.

A positive voltage supplied by the acceleration power supply 310 may be applied to the electrodes 332 by a chain of resistors 210 and a chain of hydraulic/pneumatic or electrical switches 212 to manage the beam optics depending on acceleration voltage. In the embodiment of FIG. 3, the chain of resistors 210 includes resistors 210a, 210b, 210c, 210d, 210e, 210f, and 210g. Parallel to the resistors 210, the chain of switches 212 may include switches 212a, 212b, 212c, 212d, 212e, 212f, and 212g. A resistor and its corresponding switch may be referred to as a grading resistor assembly. Thus, there are seven grading resistor assemblies shown in the charged particle acceleration/deceleration system 300 to divide acceleration voltage into seven equal potentials. It should be noted that the resistors 210 may not have the same resistance value in accordance with other embodiments of the present disclosure, and the voltage may not be divided equally. Moreover, as shown in FIG. 3, the chain of switches 212 may be grouped into 3 groups. The switches 212a, 212b, 212c, and 212d may be connected to a control cable 352. The switches 212e and 212f may be connected to a control cable 354. The switch 212g may be connected to a control cable 356. Therefore, the seven resistor assemblies may be selectively controlled by the control cables 352, 354, and 356. The chain of resistor assemblies may be referred to as a voltage grading resistor assembly chain in the present disclosure. Also, each of the control cables may be referred to as an actuator in the present disclosure.

In one exemplary embodiment of the charged particle acceleration/deceleration system 300, each of the switches 212 may be activated by pressurized air, gas or liquid as will be described later. Therefore, each actuator may be a pressurized air line made of dielectric material, and may operate switches by pressurized air, gas, or liquid (e.g., PTFE air lines).

In another exemplary embodiment of the charged particle acceleration/deceleration system 300, each of the switches 212 may be activated electrically. Therefore, each actuator may operate switch(es) 212 by transmitting electrical signals (e.g., relays).

The charged particle acceleration/deceleration system 300 is designed to achieve a wide range of energy levels for the ion beam 10 (e.g., 1 kV to about 750 kV for single charged particles). The wide range of energy levels may be achieved by a plurality of operation modes of the charged particle acceleration/deceleration system 300. The plurality of operation modes may be provided by operating the deceleration switch 316, the acceleration switch 312, the switches 212 of the grading resistor assemblies, the extraction power supply 324, the deceleration power supply 314, and the acceleration power supply 310 in tandem, as described in detail below. Further, the seven selectively controlled resistor assemblies may selectively change resistance between electrodes 332, thereby maintaining ballast current accordingly, as also described in detail below.

For example, in a first exemplary operation mode, the charged particle acceleration/deceleration system 300 may operate to achieve medium to high energy levels (e.g., 80 kV to 625 kV). In this operation mode, the deceleration switch 316 may be left open and the acceleration switch 312 may be closed. The ion beam 10 may be extracted by a positive extraction voltage provided by the extraction power supply 324. The acceleration power supply 310 may provide a positive voltage between the terminal 318 and the ground 330. Thus, after gaining initial extraction energy, the ion beam 10 may be further accelerated by the electrodes 332. This exemplary mode of operation may be referred to as an acceleration mode in the present disclosure.

In the acceleration mode of operation, the acceleration power supply 310 may provide a high positive voltage such as, but not limited to, a high positive voltage on the order of 670 kV. This acceleration mode of operation may be referred to as a high beam energy acceleration mode of operation in the high beam energy acceleration mode, the deceleration switch 316 may be designed to sustain a voltage gap of more than 670 kV (e.g., the extraction voltage and the acceleration voltage) between the ion source 102 and the ground 330.

Also, in the acceleration mode of operation, the desired energy level of the ion beam 10 may be on a low end of an energy level range, thereby allowing the positive voltage provided by the acceleration power supply 310 to be low. This acceleration mode of operation may be referred to as a low energy beam acceleration mode of operation. As previously noted, in certain circumstances, because ion beam rigidity is low, the electrodes 332 may intercept ions or secondary ions/electrons (e.g., beam strike). Therefore, higher ballast current may be required to maintain a low energy voltage potential gradient across the electrodes 332 in the acceleration mode of operation.

FIGS. 4A and 4B depict an exemplary resistor assembly 400 in two operation modes in accordance with an embodiment of the present disclosure. The resistor assembly 400 may be used in an exemplary embodiment of a charged particle acceleration/deceleration system in accordance with the present disclosure. For example, the resistor assembly 400 may be used in the charged particle acceleration/deceleration system 300. The resistor assembly 400 may be placed between the terminal 318 and the first electrode 332a, or may be placed between any two adjacent electrodes in FIG. 3. That is, electrical contacts 422 and 432 may be connected to the terminal 318 and the first electrode 332a, or may be connected to any two electrodes. A voltage gap may thereby be maintained for an acceleration or deceleration mode of operation of the charged particle acceleration/deceleration system 300.

Referring to FIG. 4A, the exemplary resistor assembly 400 is shown in a first mode of operation in accordance with an embodiment of the present disclosure. As shown in FIG. 4A, in the first mode of operation, a switch 410 is disconnected. That is, a shuttle 412 inside a housing 414 of the switch 410 is connected to a first electrical contact 418 but separated from a second electrical contact 416 by an insulating medium in the housing 414. The insulating medium may be maintained in the housing 414 by two caps 420a and 420b at two distal ends of the housing 414. The insulating medium may be air, or a high dielectric strength gas (e.g., SF6) or liquid (e.g., liquid silicone). At least a portion of the housing 414 may be made from a non-conductive material such that the two electrical contacts 416 and 418 are not electrically connected when the shuttle 412 is not in physical contact with the electrical contact 416.

The electrical contact 416 may be connected to the electrical contact 422 via two resistors 404a and 404b. The resistors 404a and 404b may be connected in series as shown. The electrical contact 418 may be connected to the electrical contact 432 via three resistors 404c, 404d, and 404e. The resistors 404c, 404d, and 404e may be connected in series as shown.

In the first mode of operation that the switch 410 is disconnected, there is no electrical current flowing through the resistors 404 and an electrical voltage difference between the electrical contacts 422 and 432 is sustained by the open switch 410. Thus, when the charged particle acceleration/deceleration system 300 is operating in the acceleration mode for a high energy level, there may be a high voltage sustained by the switch 410 (e.g., 112 kV). Therefore, the switch 410 may be an electrical or hydraulic/pneumatic switch suitable for high voltage environments, such as, but not limited to, a switch described in U.S. Pat. No. 6,717,079 issued to Heller, which is incorporated herein by reference in its entirety.

Furthermore, in the first mode of operation that the switch 410 is disconnected, the electrical voltage difference between the electrical contacts 422 and 432 is distributed across a chain of resistors 402. The resistors 402a, 402b, 402c, 402d, and 402e may be used at high and medium energy ranges and have resistance values of about 75 MΩ to 200 MΩ per resistor assembly, for example.

In another exemplary embodiment of a resistor assembly in accordance with embodiments of the present disclosure, a parallel/serial combination of resistors 402 may be used depending on the ballast current requirement.

In yet another exemplary embodiment of a resistor assembly in accordance with embodiments of the present disclosure, more than two resistors may be paralleled, and groups of paralleled resistors may be chained between the electrical contacts 422 and 432.

In still another exemplary embodiment of a resistor assembly in accordance with embodiments of the present disclosure, a single resistor may be used between the electrical contacts 422 and 432. For example, the single resistor may be a metal oxide high voltage resistor having a resistance value of about 10 to 100 MΩ, 30 to 100 kV voltage rating, and a 15 to 100 W power rating.

Referring to FIG. 4B, the exemplary resistor assembly 400 is shown in a second mode of operation in accordance with an embodiment of the present disclosure. As shown in FIG. 4B, in the second mode of operation, the switch 410 may electrically connect the electrical contacts 416 and 418. That is, the shuttle 412 may be extended across the insulating medium to connect to the electrical contact 416. The shuttle 412 may be pressurized to move cross the insulating medium by pressurized gas, as described in the Heller patent.

As previously noted, when the charged particle acceleration/deceleration system 300 operates in a low energy acceleration or deceleration mode of operation, a low voltage gap may need to be maintained across the terminal 318 and the electrodes 332. In this circumstance, the resistor assembly 400 may be used to maintain a low voltage gap between the electrical contacts 422 and 432 with a sufficient ballast current. The sufficient ballast current may be achieved by keeping resistors 404 in a low resistance, such as, but not limited to, 20 MΩ to 40 MΩ per resistor assembly, for example. Because the resistors 404 are parallel to the resistors 402, a high ballast current may be maintained for a low voltage gap (e.g., 10 kV) between the electrical contacts 422 and 432.

In another exemplary embodiment of a resistor assembly in accordance with embodiments of the present disclosure, resistors 404 may be eliminated. That is, electrical contact 416 may connect directly to the electrical contact 422 and electrical contact 418 may connect directly to the electrical contact 432. Therefore, in the second mode of operation, the resistor assembly 400 may short circuit the electrical contacts 422 and 432.

In yet another exemplary embodiment of a resistor assembly in accordance with embodiments of the present disclosure, more or less resistors may be used between the electrical contacts 416 and 422, and between electrical contacts 418 and 432.

Figure 5:
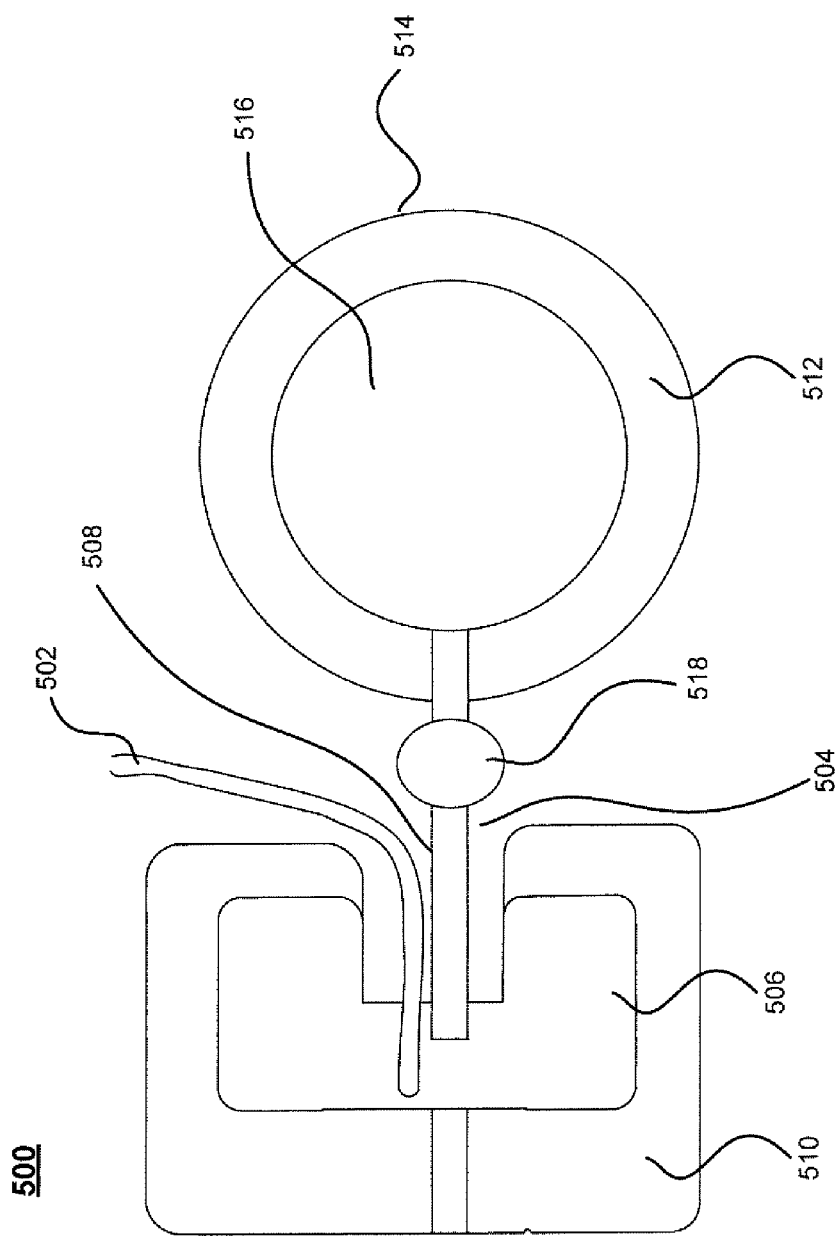
FIG. 5 depicts a sectional view of a junction of a voltage grading component, a spark gap electrode and an insulated conductor in accordance with an embodiment of the present disclosure.

FIG. 5 depicts a sectional view of an acceleration/deceleration system 500 of an ion implanter in accordance with an embodiment of the present disclosure. As illustrated in FIG. 5, an actuator 502 (e.g., an air line) may be coupled to an opening 504 of a stress shield 506 of one or more voltage grading components to actuate the one or more switches.

Because of an uneven surface at the opening 504 in the stress shield 506, an electrical field stress may be created at the opening 504. Thus, in order to alleviate the electrical field stress at the opening 504, one or more insulated conductors 514 may be coupled to the opening 504 via a stem 508. In the event that the stem 508 may be made from a conductive material, the stress shield 506 and the one or more insulated conductors 514 may be energized to the same potential. By energizing the stress shield 506 and the one or more insulated conductors 514 to the same potential, an isopotential region may be created at the opening 504 and thus eliminate the electrical field stress at the opening 504.

The stress shield 506 may be enclosed in a dielectric material 510. The one or more insulated conductors 514 may include an insulator 512 with a dielectric strength greater than 75 kV/inch disposed about a conductor 516. In one embodiment, the insulator 512 may be a solid insulator. The solid insulator may include, but not be limited to, epoxy resin, syntactic foam, chlorinated polyvinyl chloride (CPVC), polyvinylidene difluoride (PVDF), ethylene chlorotrifluoroethylene (ECTFE), polytetrafluoroethylene (PTFE), or a polyimide (e.g., kapton). In one exemplary embodiment, the insulator 512 may be made from epoxy resin having a thickness of 0.5 inches. The syntactic foam may include hollow glass spheres and/or polymer pellets dispersed about a filling compound such as epoxy resin or silicone. In one embodiment, the syntactic foam insulator may have an average dielectric strength of about 300 kV/inch on test samples about 0.25 inches thick. In other embodiments, solid insulators may have a dielectric strength greater than 150 kV/inch. Alternatively, the insulator 512 may have a chamber wall that defines an internal cavity and the internal cavity may be filled with a liquid insulator or a gas insulator. The liquid insulator may include, but is not limited to, oil. The gas insulator may include, but is not limited to, carbon dioxide ($CO_2$), sulphur hexafluoride ($SF_6$), or pressurized air. Some gases may not need to be pressurized depending on their non-pressurized dielectric strength. Vacuum insulation and/or any combination to form a composite insulation may also be utilized. The conductor 516 may be a high voltage conductor having a hollow cross-section or a solid cross-section.

The stem 508 may be coupled to the opening 504 of the stress shield 506. The stem 508 also may be coupled to the insulated conductor 514 via one or more spark gap electrodes 518 proximate an exterior portion of the voltage grading component (e.g., 208). The stem 508 may have a length to enable the insulated conductors 514 to be positioned at a predetermined distance from an exterior portion of the voltage grading component (e.g., 208). The length of the stem 508 may be varied to correspond to a required amount of electrical stress shielding. The electrical stress shielding may be reduced as the length of the stem 508 decreases. The predetermined distance may range from almost zero (nearly touching) to a maximum distance permitted by a surrounding air gap. In one exemplary embodiment, the desired distance is at least 1.5 inches, for example 2 inches. The stem 508 may be fabricated of either conductive or nonconductive material or a composite including conductive and nonconductive material. In the event that the stem 508 may be fabricated of nonconductive material, a conductor may be disposed inside the stem 508 in order to maintain the isopotential region at the opening 504.

The spark gap electrode 518 may be located between the insulated conductor 514 and stress shield 506. The spark gap electrode 518 may be calibrated to electrically breakdown at a predetermined voltage level. The geometry of the spark gap electrode 518 may be varied to electrically breakdown at the predetermine voltage level. For example, the shape of the spark gap electrode 518 may vary in order to electrically breakdown at a predetermined voltage level. In an exemplary embodiment, the spark gap electrode 518 may have a spherical shape or an elliptical shape. The radius of the spark gap electrode 518 may vary to electrically breakdown at the predetermined voltage.

The spark gap electrode 518 may be charged to a predetermine potential, for example, the same potential as the voltage grading component (e.g., 208) because the stem 508 may be made from a conductive material. The voltage grading component (e.g., 208) may include chain resistors (e.g., 210), and the spark gap electrode 518 may be disposed at a high voltage side (e.g., before the chain resistors) or a low voltage side (e.g., after the chain resistor). The spark gap electrode 518 may be disposed parallel to the chain resistor (e.g., 210) and may have a resistance lower than the chain resistor (e.g., 210). Therefore, the spark gap electrode 518 may provide the weakest path and therefore may electrically breakdown at a predetermined voltage before the chain resistor (e.g., 210). Furthermore, the spark gap electrode 518 may electrically breakdown at a high voltage and therefore an high electrical stress may be created on the surface of the spark gap electrode 518. However, the insulated conductor 514 may shield and/or reduce the high electrical stress on the surface of the spark gap electrode 518, thereby allowing the spark gap electrode 518 to electrically breakdown at a higher voltage.

For example, the spark gap electrode 518 may be designed to reduce the electrical stress and electrically breakdown as soon as transient voltage may exceed a safe operating level. For example, a 1.2 MeV ion implanter may utilize 65 kV per voltage grading component. The spark gap electrode 518 may be designed to limit the maximum transient voltage to approximately 85 kV per voltage grading component. The maximum transient voltage may be limited by utilizing the insulated conductor 514 and/or the spark gap electrode 518. The insulated conductor 514 may include insulator 512 having a thickness of 0.5 inches and conductor 516 having a diameter of 2.5 inches. The spark gap electrode 518 may have a diameter of 1 inch while the insulated conductor 514 may be spaced at 4.5 inches from an adjacent insulated conductor 514.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An acceleration/deceleration system comprising:
    an acceleration column comprising a plurality of electrodes having apertures through which a charged particle beam may pass;
    a plurality of voltage grading components respectively electrically coupled to the plurality of electrodes, the plurality of voltage grading components each having an electrical stress shield defining a recessed opening therein; and
    a plurality of insulated conductors disposed proximate the plurality of electrical stress shields to modify an electrical field about the recessed openings of the plurality of electrical stress shields.

2. The acceleration/deceleration system of claim 1, wherein the plurality of voltage grading components comprises at least one of a plurality of resistors and a plurality of switches.

3. The acceleration/deceleration system of claim 2, wherein the plurality of resistors comprises a serial chain of resistors.

4. The acceleration/deceleration system of claim 1, further comprising a stem coupled to the plurality of electrical stress shields and the plurality of insulated conductors.

5. The acceleration/deceleration system of claim 1, further comprising a plurality of actuators.

6. The acceleration/deceleration system of claim 5, wherein each switch is connected to a respective one of the plurality of actuators.

7. The acceleration/deceleration system of claim 2, wherein at least one switch is activated by pressurized fluid, and the pressurized fluid includes at least one of a pressurized air, a pressurized gas, and a pressurized liquid.

8. The acceleration/deceleration system of claim 1, further comprising a plurality of spark gap electrodes configured to electrically breakdown at a predetermined voltage.

9. The acceleration/deceleration system of claim 8, wherein the plurality of spark gap electrodes is disposed between the plurality of electrical stress shields and the plurality of insulated conductors.

10. The acceleration/deceleration system of claim 9, wherein the plurality of spark gap electrodes and the plurality of insulated conductors are disposed proximate a plurality of actuators having a plurality of actuator rods and wherein the plurality of actuator rods are directed through the plurality of recessed openings.

11. The acceleration/deceleration system of claim 2, wherein the plurality of resistors is embedded in a high dielectric strength material including at least one of a heat conductive epoxy and a silicone based compound.

12. An acceleration/deceleration system comprising:
    an acceleration column comprising a plurality of electrodes having apertures through which a charged particle beam may pass;
    a plurality of voltage grading components respectively electrically coupled to the plurality of electrodes, the plurality of voltage grading components each having an electrical stress shield defining a recessed opening therein;
    a plurality of spark gap electrodes disposed proximate the plurality of electrical stress shields to electrically breakdown at a predetermined voltage level; and
    a plurality of insulated conductors disposed proximate the plurality of electrical stress shields to modify the electrical field stress about the recessed openings of the plurality of electric stress shields.

13. The acceleration/deceleration system of claim 12, wherein the plurality of voltage grading components comprises at least one of a plurality of resistors and a plurality of switches.

14. The acceleration/deceleration system of claim 13, wherein the plurality of resistors comprises a serial chain of resistors.

15. The acceleration/deceleration system of claim 12, wherein a shape of the plurality of spark gap electrodes is configured to be at least one of an elliptical shape and spherical shape.

16. The acceleration/deceleration system of claim 13, further comprising a plurality of actuators.

17. The acceleration/deceleration system of claim 16, wherein each switch is connected to a respective one of the plurality of actuators.

18. The acceleration/deceleration system of claim 17, wherein at least one of the plurality of spark gap electrodes and the plurality of insulated conductors are disposed proximate the connection between each switch and the respective one of the plurality of actuators.

19. The acceleration/deceleration system of claim 13, wherein at least one switch is activated by pressurized fluid, and the pressurized fluid includes at least one of a pressurized air, a pressurized gas, and a pressurized liquid.

20. The acceleration/deceleration system of claim 12, wherein the plurality of insulated conductors is disposed radially further away from the plurality of electrical stress shields than the plurality of spark gap electrodes.

21. The acceleration/deceleration system of claim 13, wherein the plurality of resistors is embedded in a high dielectric strength material including at least one of a heat conductive epoxy and a silicone based compound.

22. The acceleration/deceleration system of claim 12, further comprising a stem coupled to the plurality of electrical stress shields and the plurality of insulated conductors, wherein the predetermined voltage level at which the plurality of spark gap electrodes electrically breakdown is based at least on one of a size of a conductor located within the plurality of insulated conductors, a length of the stem, and a geometry of the plurality of spark gap electrodes.

* * * * *